United States Patent [19]

Fujimura et al.

[11] Patent Number: 4,983,254
[45] Date of Patent: Jan. 8, 1991

[54] PROCESSING FOR STRIPPING ORGANIC MATERIAL

[75] Inventors: Shuzo Fujimura, Tokyo; Keisuke Shinagawa, Kawasaki; Kenichi Hikazutani, Kuwana, all of Japan

[73] Assignee: Fujitsu Limited, Kanagawa, Japan

[21] Appl. No.: 460,798

[22] Filed: Jan. 4, 1990

[30] Foreign Application Priority Data

Jan. 10, 1989 [JP] Japan .................................. 01-3303

[51] Int. Cl.$^5$ .................. B44C 1/22; B29C 37/00; C03C 15/00; C03C 25/06
[52] U.S. Cl. .................................. 156/643; 134/1; 156/646; 156/655; 156/668; 156/345; 204/192.36; 204/298.38
[58] Field of Search ............... 156/643, 646, 655, 668, 156/345; 204/164, 192.36, 298.38; 134/1, 2, 30, 102

[56] References Cited

U.S. PATENT DOCUMENTS 4,699,689 10/1987 Bersin .................................. 156/643
4,749,440 1/1978 Blackwood et al. ........... 156/345 X

OTHER PUBLICATIONS

Extended Abstracts "The 49th Autumn Metting, 1988", The Japan Society of Applied Physics, pp. 553–554, and Partial English Translation Thereof.

*Primary Examiner*—William A. Powell
*Attorney, Agent, or Firm*—Armstrong, Nikaido, Marmelstein, Kubovcik & Murray

[57] ABSTRACT

A process for stripping an organic material, which comprises forming gases including a gas containing oxygen and a gas containing a halogen into plasma in a plasma chamber, and supplying an active species of the halogen in the gas formed plasma to a reaction chamber to strip the organic material in the reaction chamber, wherein one mole or more of water vapor based upon two moles of the halogen molecule is fed to the reaction chamber, and the active species of the halogen are removed before contact thereof with the organic material.

15 Claims, 6 Drawing Sheets

PROCESSING FOR STRIPPING ORGANIC MATERIAL

BACKGROUND OF THE INVENTION

1. Field of the Invention

The present invention relates to a process for oxidizing an organic material, for example, a resist such as a photoresist, X-ray resist, electron beam resist, to be used in the production of, for example, semiconductor devices, to thereby effect an ashing thereof, as well as in the production of liquid crystal devices and plasma displays.

In the production of semiconductor devices, usually a photoresist (hereinafter abbreviated as resist) is used as a mask when etching a wafer, and as the resist becomes unnecessary after the etching treatment, it must be removed. The removal methods include the wet treatment system in which a resist stripping solution is used, and the dry treatment system of ashing the resist in an active species of oxygen atoms or an oxygen plasma.

Currently, dry treatments, which comprise simple ashing steps but can also treat the resist carbonized in the process of ion injection, are widely used, and among these treatments, the downstream ashing method, which causes little or no damage to the wafer, is most widely used.

In the currently used dry treatment utilizing the downstream ashing method, the method in which a gas composed mainly of oxygen gas is used for the ashing is usually employed. Nevertheless, since the ashing rate (i.e., amount of organic material per unit of time) is low, the wafer must be heated to about 200° C. or higher to obtain a satisfactory ashing rate. If the wafer is thus heated, however, a minute amount of heavy metals and alkaline metals contained in the resist is introduced into the wafer, whereby the contamination problems of the wafer arises, as is well known in the art.

Accordingly, the development of a technique by which a satisfactory ashing rate can be obtained at a low temperature, at which contamination of the wafer does not occur, is underway.

2. Description of the Related Art

The resist ashing method of the prior art is described with reference to the device used for the downstream ashing method shown in FIG. 4.

As shown in FIG. 4, a vacuum reaction chamber 6 is connected to the vacuum pump P, the reaction gases are fed through the gas introducing inlet 3 into the plasma generation chamber 4 provided in reaction chamber 6, and are then formed into a plasma by, for example, microwaves at a frequency of, for example, 2.45 GHz, transmitted through a microwave transmission window 2 by a waveguide 1.

Among the ions, electrons, and active species formed by plasma formation, the ions and the electrons are shielded by the earthed shower head 5, and residual active species pass through the shower head 5 and flow down toward the wafer 8 on the stage 7. The active species come into contact with the wafer 8 and remove the resist film, comprising an organic material (not shown) coated on the wafer 8, by ashing.

In the prior art, the downstream ashing method usually practiced uses the device shown in FIG. 4, in which is used the method by which a gas composed mainly of oxygen is introduced, as the gas for ashing, through the gas introducing inlet 3, formed into a plasma, and subjected to a downstream to bring the active species of oxygen atoms into contact with the wafer 8.

According to this method, since the activation energy during the ashing is as high as 0.52 eV, the influence on the ashing rate of the temperature (i.e., temperature dependency) is great, and thus the reproducibility and controllability of the ashing are poor. Further, when the stage temperature is 180° C., the ashing rate is as low as 0.2 μm/min and therefore, to obtaining the minimum limit of an about 0.5 μm/min. of ashing rate required for practical application, the wafer 8 must be heated to about 200° C. or higher, and accordingly, the contamination problems of the wafer 8 arises.

Accordingly, methods which enable ashing at a lower temperature than that used in the downstream method by using a gas composed mainly of oxygen, have been proposed and are described as follows.

(a) Downstream ashing method using oxygen ($O_2$) and water ($H_2O$):

This method uses the device shown in FIG. 4, which performs ashing by introducing $O_2$ and $H_2O$ through the gas introducing inlet 3 to form the same into a plasma, which is then subjected to a downstream to bring active species of oxygen atoms formed from oxygen, oxygen atoms, and hydrogen atoms and OH formed from $H_2O$, into contact with the wafer 8.

In this method, the relationship between the ratio of $H_2O$ to the total amount of the gas mixture of $O_2$ and $H_2O$ is shown in FIG. 6. It should be noted that the stage temperature is 180° C., and the flow rate of the gas mixture of $O_2$ and $H_2O$ is 1 liter/min.

As seen from the FIG. 6, when the ratio of $H_2O$ is increased, the ashing rate reaches a maximum value of 0.35 μm/min., which is about 2-fold that of the ashing method using a gas composed mainly of oxygen, when the content of $H_2O$ is 30% to 40%. Even when the ratio of $H_2O$ is further increased, the ashing rate is not substantially lowered.

This is considered to be because the oxygen atoms formed from $H_2O$ and other active species participate in the ashing, together with the oxygen atoms formed from oxygen.

Also, the activation energy is less, at 0.39 eV, compared with the ashing method using a gas composed mainly of oxygen. This is considered to be due to a lowering of the activation energy by OH formed primarily from $H_2O$.

As the result, in addition to enabling ashing at a temperature lower than that used in the ashing method using a gas composed mainly of oxygen, the temperature dependency is reduced, and thus the reproducibility and controllability are improved. To obtain a practical ashing rate, however, the wafer 8 must be heated to about 200° C. or higher, and thus the contamination problems of the wafer still remains.

Next, in the method using a gas composed mainly of oxygen, it is known that a satisfactory rate can be obtained at a low temperature by an addition of a fluorine gas, as described below:

(b) Downstream ashing method using a gas containing oxygen and a halogen:

It is known in the art that the ashing rate of 1 μm/min. or higher, which is about 5-fold higher than that of the method using a gas composed mainly of oxygen, can be obtained when about 10% to 15% of a gas containing a small amount of halogen, for example, carbon tetrafluoride ($CF_4$) in oxygen, is added to the plasma by using the device shown in FIG. 4.

This is because the gas containing a halogen promotes the dissociation of oxygen into oxygen atoms, when the gas containing oxygen and a halogen is formed into a plasma.

Further, when even a small amount of a gas containing fluorine, as a halogen, is added, and the active species of the fluorine come into contact with the wafer 8, the activation energy during ashing is remarkably lowered to about 0.05 eV, compared with the method using only oxygen (V. Vukanovic et al., J. vac. Sci. Technol., B6 (1), Jan/Feb 1988 pp. 66, J. M. Cook and Brent W. Benson, J. Electrochem. Soc. Vol., 130,No. 12, December, 1983, pp. 2459).

In this method, the active species of oxygen atoms are increased, to improve the ashing rate, and at the same time, ashing at room temperature is possible due to a lowering of the activation energy by the action of fluorine, and further, an additional advantage is gained in that the temperature dependency is greatly reduced. Nevertheless, when the fluorine atoms reach the $SiO_2$ surface, a drawback arises in that the substrate layer of, for example, $SiO_2$, may be etched during the ashing process.

As a method which provides a satisfactory ashing rate even at room temperature, the method of performing ashing by using a gas containing mainly fluorine is known. This method is described below.

(c) Downstream ashing method by addition of water ($H_2O$) during downstream of nitrogen trifluoride ($NF_3$):

As shown in FIG. 5, a downstream ashing device which is an improvement of the device shown in FIG. 4 is used This method comprises injecting $NF_3$ through the gas introducing inlet 3 to form a plasma, and then subjecting the active species of fluorine atoms to a downstream through the shower plate 5. During the downstream from the addition inlet 9, $H_2O$ is added in an amount smaller than the amount of $NF_3$ injected, whereby the chemical reaction with fluorine and $H_2O$, as shown below, occurs

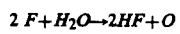

$$2 F + H_2O \rightarrow 2HF + O$$

to generate the oxygen atoms necessary for ashing. Also, residual fluorine atoms which have not undergone the chemical reaction withdraw H from the C—H bond on the resist surface, thereby substituting for the H (H. Okano et al. The Electrochem. Soc. Spring Meeting, Atlanta, May 15–20, 1988).

According to this method, the ashing rate is improved by the oxygen atoms formed by the chemical reaction between the $H_2O$ and fluorine atoms, and the residual fluorine atoms, which have not undergone the chemical reaction. Further, the activation energy is lowered by a substitution of H from the C—H bond on the resist surface with fluorine atom, and accordingly, in addition to enabling ashing at room temperature, an advantage is gained in that the temperature dependency is greatly reduced.

Nevertheless, because fluorine atoms reach the surface of the wafer 8 the problem of an etching of the substrate layer such as $SiO_2$ arises, and further, because oxygen atoms are obtained by an exothermic reaction between fluorine atoms and $H_2O$, the wafer surface is heated by excess heat radiated therefrom, whereby the contamination problems of the wafer 8 with, for example, heavy metals, arises.

In the prior art methods described above, a gas composed mainly of oxygen is used, and in the downstream ashing method with oxygen and water of (a), the wafer temperature must be raised to 200° C. or higher, to obtain a practical ashing rate, and thus the problem of wafer contamination arises.

In the methods of using a halo-containing gas, namely (b) the method of using a gas containing oxygen and a halogen, and (c) the method of adding water during the downstream of nitrogen trifluoride ($NF_3$), because fluorine, which a gas containing a halogen, is used to obtain a practical ashing rate even at room temperature, a problem arises in that the substrate layer of for example, $SiO_2$, is etched.

Further, in the downstream ashing method of (c), because the chemical reaction between water and fluorine atoms is an exothermic reaction, and therefore, the wafer surface is excessively heated, and thus the contamination problems of the wafer can arise.

As described above, according to the methods of the prior art, it is impossible to obtain a satisfactory ashing rate at a low temperature without etching the substrate layer, and without generating a contamination of the wafer.

Recently, the present inventors briefly reported a possibility of a downstream ashing method using $O_2$, $CF_4$, and $H_2O$ as an ashing gas in Extended Abstracts of the 49th Autumn Meetings, 1988; The Japan Society of Applied Physics page 553 (October, 1988). This method is disclosed in a copending U.S. patent application Ser. No. 361178 filed June 5, 1989.

SUMMARY OF THE INVENTION

Accordingly, the objects of the present invention are to eliminate the above-mentioned disadvantages of the prior art and to provide a method of stripping an organic material by which the substrate layer (e.g. silicon dioxide, silicon nitride) is not etched, a satisfactory ashing rate at a low temperature is obtained, and the semiconductor elements or other devices are not damaged.

Another object of the present invention is to provide a device for stripping an organic material with plasma.

Other objects and advantages of the present invention will be apparent from the following description.

In accordance with the present invention, there is provided a process for stripping an organic material, which comprises forming gases including a gas containing oxygen and a gas containing a halogen into plasma in a plasma chamber, and supplying an active species in the gas formed plasma to a reaction chamber to strip the organic material in the reaction chamber, wherein an amount of water vapor of at least one mole based upon two moles of the dissociated halogen atom is fed into the reaction chamber, and the active species of the halogen are removed before contact thereof with the organic material.

BRIEF DESCRIPTION OF THE DRAWINGS

The present invention will be better understood from the description set forth below with reference to the accompanying drawings, wherein.

DESCRIPTION OF THE PREFERRED EMBODIMENTS

Figure 1:
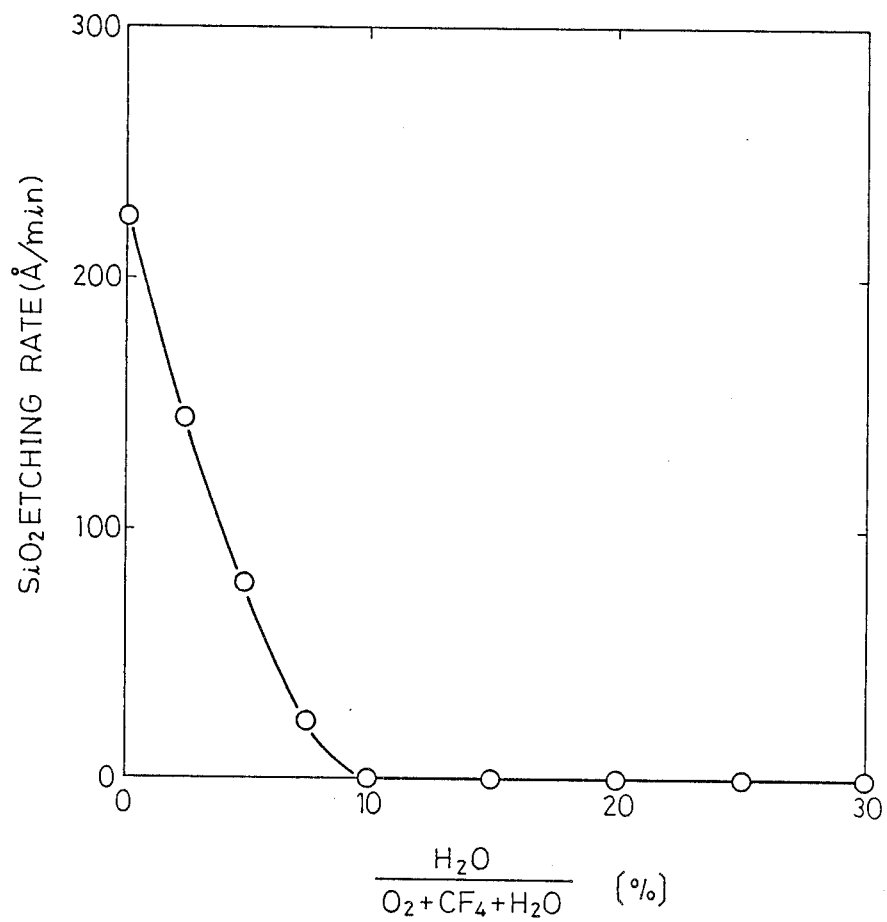
FIG. 1 is a graph showing the relationship between the added amount of water and the $SiO_2$ etching rate in one example of the present invention.

The process for ashing an organic material in the present invention is described below.

By forming gases including a gas containing oxygen and a gas containing a small amount of a halogen into plasma in the plasma chamber 4 (see FIG. 5), the gas containing the halogen promotes oxygen into oxygen atoms, to increase the amount of oxygen atoms. Examples of the oxygen-containing gas are oxygen, air a mixture of oxygen with an inert gas, $CO_2$, and $N_2$. Examples of the halogen-containing gas are $F_2$, $Cl_2$, $Br_2$, HF, $CF_4$, $NF_3$, $C_2F_6$, $C_3F_8$, $CHF_3$, $SF_6$, $CCl_4$, $ClF_3$, $CCl_2F_2$, $C_2ClF_5$, $C_2Cl_2F_4$, $ClF_3$ and HBr, $CBrF_3$, and xenon fluoride. The use of the fluorine-containing gas is preferable.

The ratio of the halogen-containing gas/(the halogen-containing gas + the oxygen-containing gas) is preferably 0.05 to 0.3, more preferably 0.1 to 0.25, in terms of a mole ratio.

When the active species in the gas formed into plasma are supplied to the vacuum reaction chamber 6, and water vapor is added in an amount of at least one mole, preferably 1.2 to 2.4 moles, based upon 2 moles of the dissociated halogen atom (i.e., active species), during the course of the downstream of the active species, the following chemical reaction occurs:

$$2X + H_2O \rightarrow 2HX + O.$$

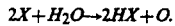

By utilizing this chemical reaction, the active species of halogen formed by the halogen-containing gas, which is utilized to promote a dissociation of oxygen, are substantially completely removed, and therefore, the substrate layer (e.g., $SiO_2$, SiN) is not etched.

Also, a part of the added water vapor is separated into oxygen atoms, hydrogen atoms, and OH by a secondary reaction with the active species in the downstream, to thereby increase the active species, and as a result, the amount of oxygen atoms and other active species participating in the ashing is increased, and thus the ashing rate is improved.

Further, when the active species come into contact with the organic material, to effect ashing, the activation energy is lowered by the OH generated by the secondary reaction, whereby ashing at a lower temperature becomes possible, and further, the temperature dependency is reduced to thereby improve the reproducibility and controllability.

Although the chemical reaction between water and atoms of a halogen is an exothermic reaction, only a small amount of the gas containing a halogen need be used, because it is utilized for the dissociation of oxygen, whereby the amount of heat generated is reduced to an extent such that it does not affect the wafer.

The water vapor can be introduced into the reaction chamber by evacuating the content of a water vessel containing water. The water vessel can be optionally heated by a heater (e.g. an electric heater). The water vapor can also be introduced into the reaction chamber by bubbling the water in the water vessel with an inert carrier gas (e.g., $N_2$, $O_2$, $H_2$, Ar, He).

EXAMPLES

The process for ashing organic material of the present invention is described with reference to Examples which utilize the downstream ashing process for the ashing of a resist coated on the surface of a wafer.

In this Example (see FIG. 5), as the substrate of the sample to be ashed, a silicon wafer 8 having a diameter of 4 inches (about 10 cm) was used, a substrate layer of $SiO_2$ is formed on the surface of the wafer 8 by the thermal oxidation method, and a resist of OFPR 800 (i.e., cresol-novolak resin type positive photoresist, a product of Tokyo Ohka K. K.), was then coated thereon by the spin coating method.

Figure 4:
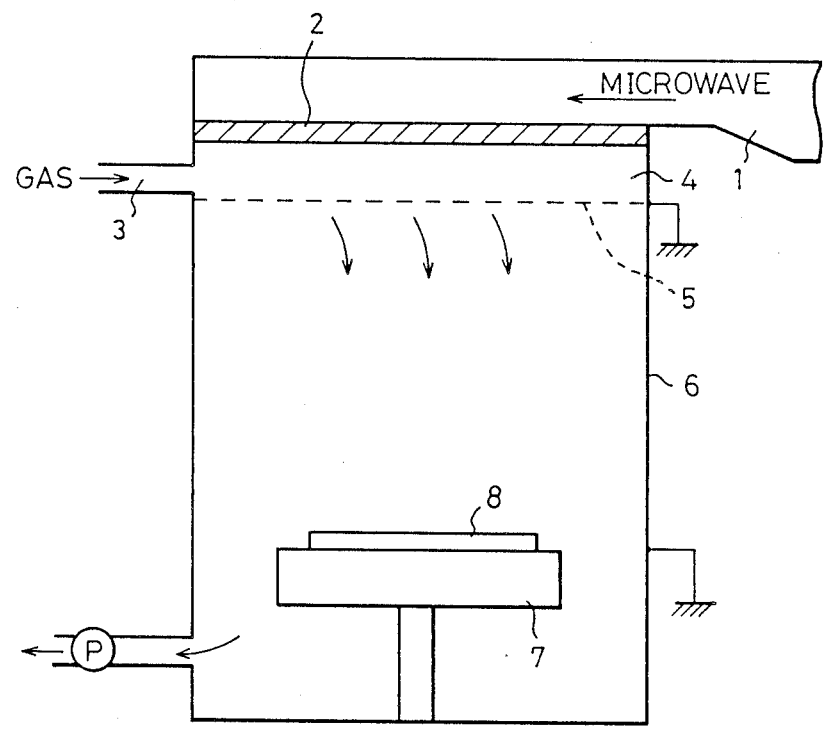
FIG. 4 is an illustration showing the downstream ashing device of the prior art.
Figure 5:
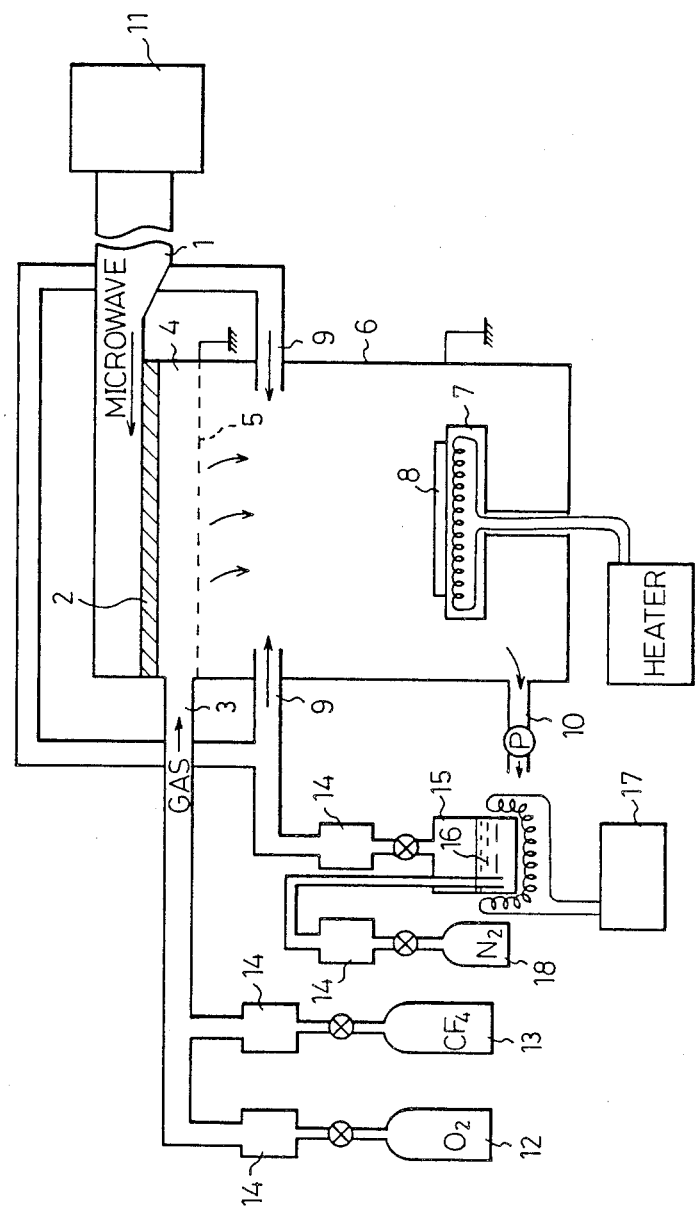
FIG. 5 is an illustration showing the improved downstream ashing equipment of the device shown in FIG. 4; and, FIG. 6 is a graph showing the relationship between the added amount of water and the ashing rate of the resist in the downstream ashing method of the prior art using oxygen and water.
Figure 6:
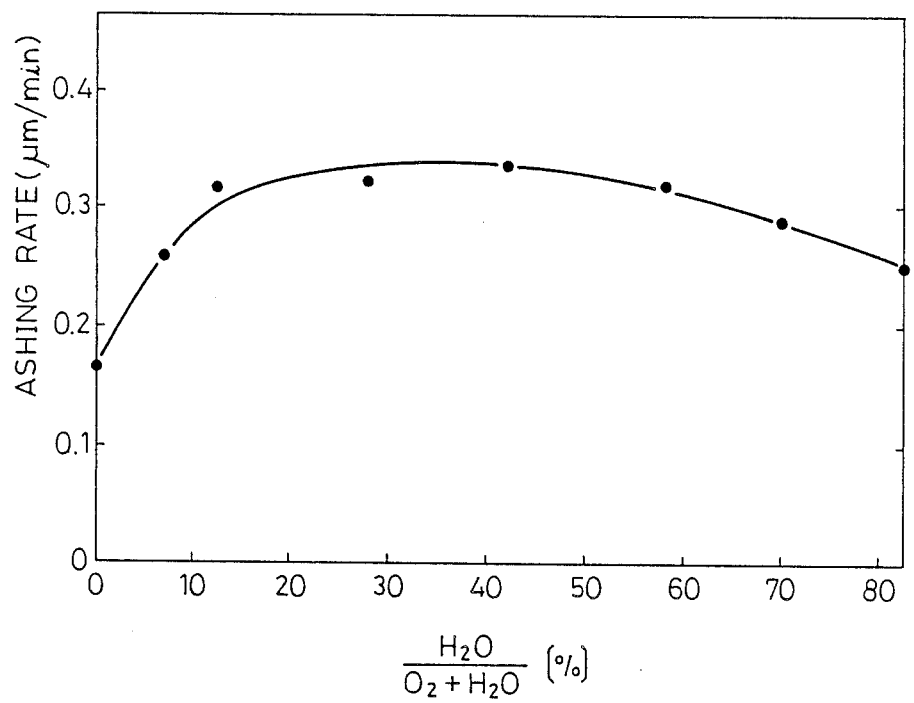

The device shown in FIG. 5 is used as the ashing device. This device has a plurality of water vapor inlets 9 capable of supplying water to be uniformly added to the reaction chamber 6, and control the amounts of water supplied through the water vapor inlets 9. The other arrangements are similar to those as shown in FIG. 4.

The ashing conditions when performing ashing by using the device shown in FIG. 5 are described below.

The pressure in the reaction vessel 6 is maintained at usually 0.1 to 3 Torr, typically about 0.8 Torr, and a microwave having a frequency of, for example, 2.45 GHz generated from a microwave generating device 11 is transmitted by a waveguide 1. A radio frequency can also be used instead of the microwave. As the gases for the ashing, for example, oxygen and a small amount of $CF_4$, introduced through the gas introducing inlet 3 from the bombs 12 and 13 through a mass flow controller 14, are used, and water in a saturated vapor pressure state is supplied through the water vapor inlet 9. The total amount of oxygen, $CF_4$, and water at this time is controlled to one liter/min. The water vapor can be introduced by evacuating a water vessel 15 containing water 16 via a mass flow controller 14 or by bubbling an inert gas (e.g., $N_2$) from a bomb 18 via a mass flow controller 14. The water vessel 15 can be appropriately heated by a heater 17.

In this Example, to facilitate the comparison between measured values, the gases formed into a plasma are given a constant ratio of an amount of $CF_4$ of 15% relative to the amount of a gas mixture of the oxygen and $CF_4$.

Based on the conditions of the ashing device and the sample as described above, the following measurement was performed.

First, the change in the $SiO_2$ etching rate was determined when the added amount of water was varied from 0 to 30%.

At this time, a sample having $SiO_2$ formed on the whole surface of the wafer 8 as described above was used. The sample was mounted on a stage 7 having a temperature of 150° C., ashing was performed for 10 minutes, a measurement was conducted after ashing by a known esoprimetric method, and the $SiO_2$ etching rate was obtained from the result of that measurement. The minimum limit of this measurement method is 5 Å. The results are shown in FIG. 1.

In FIG. 1, the axis of the ordinate depicts the $SiO_2$ etching rate, and the axis of the abscissa depicts the ratio of water relative to the total amount of oxygen, $CF_4$, and water.

When water was not added, the $SiO_2$ was etched at an etching rate of about 230 Å. As the added amount of water was increased, the etching rate was gradually lowered, and no etching of the $SiO_2$ occurred when the added amount of water was more than about 10%.

From this result, it can be seen that, of the reduced active species, only the fluorine atoms participate in the etching of the $SiO_2$, and accordingly, it can be seen that, if the added amount of water is increased to more than about 10%, substantially all of the fluorine atoms are removed before reaching the wafer, whereby no etching of the $SiO_2$ occurs.

Next, the ashing rate when setting the temperature of the stage 7 at room temperature, 150° C., and 180° C., and varying the added amount of water from 0 to 25%, was determined.

At this time, a wafer 8 having a resist coated to a thickness of 1.1 μm on the surface thereof was used as the sample. After ashing of the sample for 30 seconds, the thickness of the resist was measured by a contact needle type step difference measuring instrument, and the ashing rate of the resist was calculated.

Figure 2:
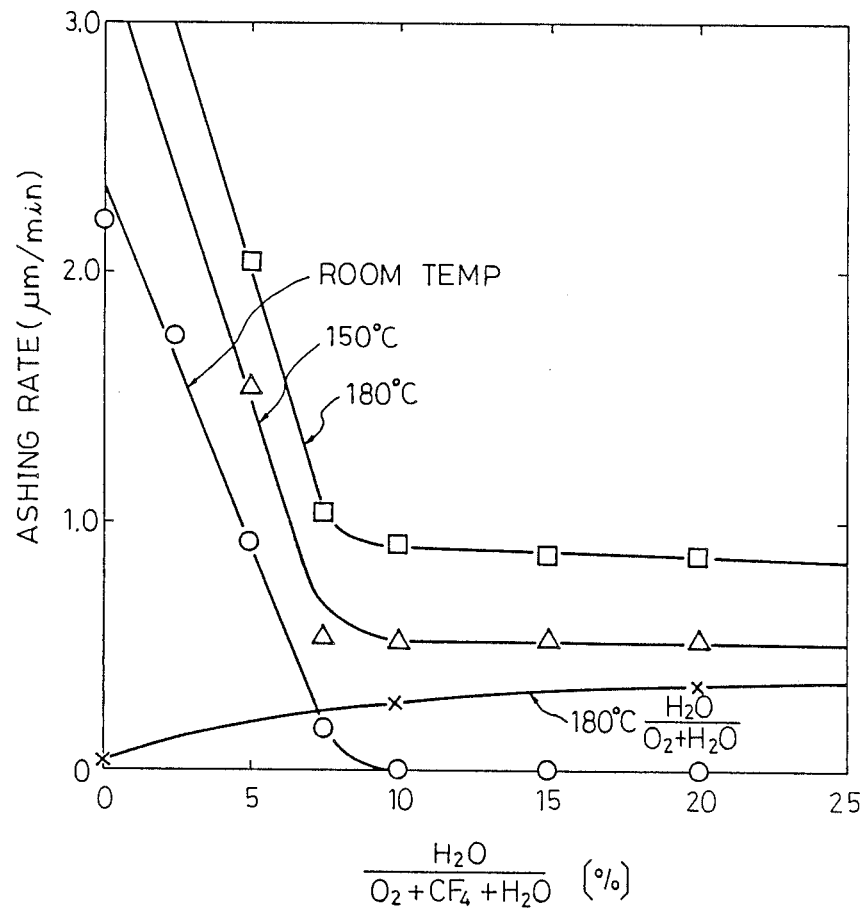
FIG. 2 is a graph showing the relationship between the added amount of water relative to the temperature of the wafer in one example of the present invention.

The results are shown in FIG. 2.

In FIG. 2, the axis of the ordinate depicts the ashing rate of the resist, and the axis of the abscissa depicts the ratio of water to the total amount of oxygen, $CF_4$, and water.

When water was not added, the ashing rate was very high, at 1 μm/min. or more, even when the temperature of the stage 7 was at room temperature, and thereafter, as the added amount of water was increased to about 10%, the ashing rate was lowered. When the added amount of water exceeded about 10%, the ashing rate of a wafer at room temperature could not be measured, and the ashing rate became about 0.5 μm/min. and about 0.9 μm/min., at wafer temperatures of 150° C., and 180° C., respectively.

As a result, when the added amount of water is made about 10% or more, at which etching of the substrate layer does not occur, although the ashing rate, which is about 0.9 μm/min. at a wafer temperature of 180° C., is lower than when the added amount of water is less than about 10%, the ashing rate is improved about 5-fold compared with the method of the prior art in which the gas composed mainly of oxygen is used, and about 2.5-fold compared with the method in which $O_2+H_2O$ are used as shown in FIG. 4.

The ashing rate is smaller when the added amount of water is about 10% or more than when it is smaller than about 10%. This may be considered to be due to an increased activation energy caused by the removal of fluorine atoms, and this can be readily estimated also from the tendency toward a change of the $SiO_2$ etching rate shown in FIG. 1 with the added amount of water of 10% as the boundary, which is the same as the ashing rate tendency shown in the FIG. 1.

Accordingly, since the active species amount of oxygen atoms is increased by a generation of secondary oxygen atoms through the chemical reaction between water and fluorine, and further, oxygen atoms through the oxygen dissociation action of fluorine, and oxygen atoms and other active species through the secondary reaction can be obtained, the ashing rate is improved compared with the method in which $O_2+H_2O$ are used.

Next, the change in activation energy was determined when the added amount of water was varied from 0 to 30%.

The activation energy at this time was determined as described below. A wafer 8 surface coated with a resist to a thickness of 1.1 μm as used as the sample. The sample was mounted on the stage, and after ashing was performed by varying the stage temperature at predetermined temperature intervals each time the added amount of water was varied, the thickness of the resist was measured by a contact needle type step difference measuring instrument, and the ashing rate of the resist was calculated. By plotting the values on the axis of the ordinate on the logarithmic scale and the absolute temperatures on the axis of the abscissa on a reciprocal number scale, to prepare an Arrhenius plot, the activation energy was determined from the slope of the straight line.

Figure 3:
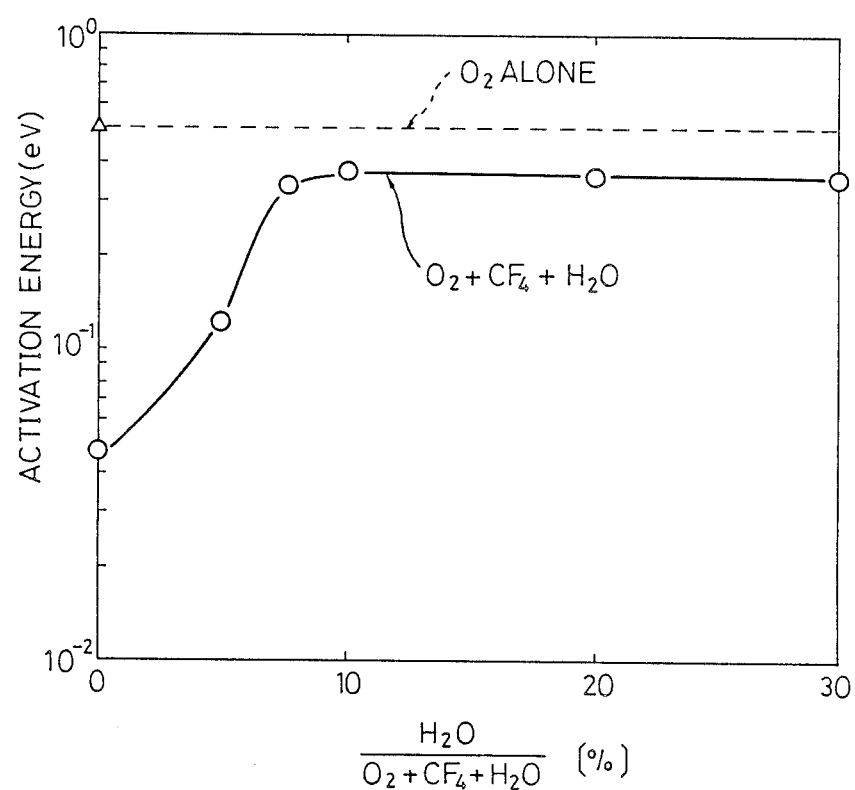
FIG. 3 is a graph showing the relationship between the added amount of water vapor and the activation energy in one example of the present invention.

The results are shown in FIG. 3.

In FIG. 3, the activation energy is shown on the logarithmic scale on the axis of the ordinate, and the ratio of water relative to the total amount of oxygen, $CF_4$, and water on the axis of the abscissa.

When water was not added, the activation energy was as low as 0.05 eV, due to the influence of the fluorine atoms. Subsequently, as the added amount of water was increased to about 10%, the activation energy became higher, until at about 10% or higher, the activation energy became stabilized at about 0.39 eV, as in the downstream ashing method in which oxygen and water were used.

As a result, when the added amount of water was about 10% or more, although the value of the activation energy of about 0.39 eV was greater than when the added amount of water was about 10% or less, as shown in FIG. 3, it became smaller compared with the 0.52 eV obtained in the method of the prior art in which a gas composed mainly of oxygen was used.

Accordingly, in addition to enabling ashing at a lower temperature than in the method of the prior art, by using a gas composed mainly of oxygen, the temperature dependency was reduced and thus the reproducibility and controllability were enhanced.

This phenomenon is understood to be due to the fact that, if the added amount of water is about 10% or more, fluorine atoms can be removed to eliminate the influence of the fluorine, whereby OH formed from water by a secondary reaction mainly determines the activation energy.

From the above description, in this Example, when ashing of the resist is performed in the state in which the added amount of water is less than about 10%, namely the state in which the added amount of water is smaller than the amount of active species of fluorine atoms, a high ashing rate can be obtained at room temperature. Nevertheless, as shown in FIG. 1, since the $SiO_2$ substrate layer is etched, which has an adverse influence on the element formed on the wafer 8, ashing is not performed.

Therefore, in this Example, water is added in an amount larger than that of the active species of fluorine atoms. That is, when the ratio of $CF_4$ relative to the amount of the gas mixture of oxygen and $CF_4$ is 15%, ashing is performed with the added amount of water of about 10% or more. Accordingly, since all fluorine atoms are removed by the $H_2O$ added during the course of the downstream, before reaching the wafer, no etching of the substrate layer by fluorine atoms occurs, and further, due to the oxygen atoms obtained by the oxygen dissociation action of fluorine, the oxygen atoms generated by the chemical reaction of fluorine and water, and the oxygen atoms formed by the secondary reaction, the number of oxygen atoms can be increased, and therefore, when the stage temperature is 180° C., the ashing rate can be greatly improved to about 5-fold that of the method using a gas composed mainly of oxygen, and about 2.5-fold that of the method using oxygen and water.

Also, OH formed by a separation of water lowers the activation energy to 0.39 eV, which is less than the 0.52 eV obtained in the method of the prior art in which a gas composed mainly of oxygen is used, and thus in addition to enabling ashing at a lower temperature, the temperature dependency is reduced and the reproducibility and controllability are accordingly enhanced.

As comparative tests, the following experiments were effected. First, according to the present invention, the above-mentioned resist ashing was carried out under the following conditions:
$CF_4/(O_2+CF_4) = 15\%$
$O_2+CF_4 = 1$ liter/min.
Water vapor = about 200 ml/min.
Microwave = 1.5 KW
Vacuum of reaction chamber = 0.8 Torr
Wafer temperature = 160° C.

The ashing rate was about 10,000 Å/min.

As a Comparative Example, the water vapor was fed to the plasma chamber, together with $CF_4$ and $O_2$, under the following conditions. The other conditions were the same as above.
$O_2+CF_4+H_2O = 1$ liter/min.
$CF_4/O_2 = 15\%$
$H_2O$ = about 100 cc/min.

The ashing rate was about 7,500 Å/min. Thus, about 33% increase in the ashing rate was attained by the present invention.

The process in this Example is not limited to the ashing of a resist, but also can be applied to the oxidation and ashing of a large number of organic materials other than a resist. Also, although $CF_4$ was employed as the gas for ashing, similar effects can be obtained even when the other fluorine-containing gases (e.g., $C_2F_6$ and $NF_3$), which are fluorinated gases, are employed, and a gas containing a halogen also may be used.

As described above, in the present invention, the number of oxygen atoms participating in the ashing is increased by removing all halogen atoms before they reach the wafer, and further, the reproducibility and controllability are enhanced by lowering the activation energy to thereby reduce the temperature dependency. Accordingly, the effect of obtaining a high ashing rate at a low temperature, without etching the substrate layer, can be exhibited, and in the production of semiconductor devices, good semiconductor elements can be obtained without damage thereto, whereby the present invention can make a great contribution to the industry.

We claim:

1. A process for stripping an organic material, which comprises forming gases including a gas containing oxygen and a gas containing a halogen into plasma in a plasma chamber, supplying an active species of the halogen in said gas formed plasma to a reaction chamber to strip the organic material in said reaction chamber, wherein at least one mole of water vapor based upon two moles of the dissociated halogen atom is introduced into said reaction chamber, and said active species of the halogen are removed before contact thereof with said organic material.

2. A process as claimed in claim 1, wherein the gases fed to the plasma chamber are oxygen and a fluorine-containing gas.

3. A process as claimed in claim 2, wherein the fluorine-containing gas is at least one compound selected from the group consisting of $F_2$, $CF_4$, $C_2F_6$, $NF_3$, $SF_6$, $ClF_3$, $CHF_3$, $CClF_3$, $C_2ClF_5$, $C_2Cl_2F_4$, $CCl_2F_2$, $CBrF_3$, and xenon fluoride.

4. A process as claimed in claim 1, wherein the plasma is generated by microwave or radio frequency.

5. A process as claimed in claim 1, wherein $O_2$ and a fluorine-containing gas are used as the gas fed to the plasma chamber in an amount of a fluorine-containing gas/($O_2$+a fluorine-containing gas) of 0.05 to 0.3 in terms of a mole ratio.

6. A process as claimed in claim 5, wherein the ratio of a fluorine-containing gas/($O_2$+a fluorine-containing gas) is 0.1 to 0.25 in terms of a mole ratio.

7. A process as claimed in claim 1, wherein $O_2$ and a fluorine-containing gas are used as the gases fed to the plasma chamber and the water vapor is introduced in an amount of 1.2 to 2.4 moles based upon 2 moles of the dissociated halogen atom.

8. A process as claimed in claim 1, wherein the organic material is a resist coated on a wafer having a silicon dioxide or silicon nitride layer on the top surface thereof.

9. A process as claimed in claim 1, wherein the water vapor is generated from a water vessel by bubbling with at least one carrier gas selected from the group consisting of nitrogen, oxygen, hydrogen, argon, and helium.

10. A device for stripping an organic material comprising:
a reaction chamber provided with a stage for placing the organic material to be treated; a plasma generating means; a gas introducing inlet; a shower head; a water vapor inlet means; and a gas evacuating conduit.

11. A device as claimed in claim 10, wherein the device comprises a plasma chamber to which a gas containing oxygen and a gas containing a halogen are fed and a reaction chamber to which a water vapor is introduced, whereby the water-vapor is reacted with a halogen atom derived from the halogen-containing gas.

12. A device as claimed in claim 10, wherein the device further comprises a water vessel provided with a heater.

13. A device as claimed in claim 10, wherein the device further comprises a carrier gas bomb.

14. A device as claimed in claim 10, wherein a plurality of the inlets for the water vapor is provided at the periphery of the reaction chamber.

15. A device as claimed in claim 10, wherein the water vapor inlet means in the form of a slit elongated over the entire periphery of the reaction chamber.

* * * * *

UNITED STATES PATENT AND TRADEMARK OFFICE
CERTIFICATE OF CORRECTION

PATENT NO. : 4,983,254

DATED : January 8, 1991

INVENTOR(S) : FUJIMURA et al

It is certified that error appears in the above-identified patent and that said Letters Patent is hereby corrected as shown below:

On the title page, Item [54], "PROCESSING FOR STRIPPING ORGANIC MATERIAL" should read --PROCESS FOR STRIPPING ORGANIC MATERIAL--.

Column 1, lines 2 and 3, "PROCESSING FOR STRIPPING ORGANIC MATERIAL" should read --PROCESS FOR STRIPPING ORGANIC MATERIAL--.

Signed and Sealed this

Twenty-eighth Day of July, 1992

Attest:

DOUGLAS B. COMER

*Attesting Officer*     *Acting Commissioner of Patents and Trademarks*